Dec. 19, 1967 R. M. WARNER, JR 3,359,503

HIGH GAIN AMPLIFIER EMPLOYING CASCADED OPPOSITE CONDUCTIVITY FIELD EFFECT TRANSISTORS

Filed May 18, 1965

INVENTOR.
Raymond M. Warner Jr.
BY
Mueller, Aichele & Rauner
ATT'YS.

United States Patent Office 3,359,503
Patented Dec. 19, 1967

3,359,503

HIGH GAIN AMPLIFIER EMPLOYING CASCADED OPPOSITE CONDUCTIVITY FIELD EFFECT TRANSISTORS

Raymond M. Warner, Jr., Scottsdale, Ariz., assignor to Motorola, Inc., Franklin Park, Ill., a corporation of Illinois Filed May 18, 1965, Ser. No. 456,760
9 Claims. (Cl. 330—17)

ABSTRACT OF THE DISCLOSURE

An amplifier circuit including an input field effect transistor of one conductivity type and a current limiting load connected in series therewith between a bias terminal and a reference potential. The input field effect transistor provides a drive signal to an output field effect transistor which is opposite in conductivity from the input field effect transistor and is biased in the unconventional manner with reverse drain voltage polarity. The amplifier circuit has a high input impedance to signals applied to the input field effect transistor and the impedance at the output of the output field effect transistor is low, thereby providing a high gain characteristic for the amplifier.

This invention relates generally to semiconductor amplifier circuits, and more particularly to an amplifier including a plurality of field effect transistors and which provides a high impedance input and a low impedance output.

In many applications it is desired to provide a semiconductor amplifier circuit which has generally the same characteristics as a triode vacuum tube. For example, such an amplifier is desired for use in a public address system wherein the input is derived from a crystal microphone having a high impedance and the output is applied to a loudspeaker having a low impedance. It is preferred to use field effect transistors in such an amplifier so that the entire circuit can be provided in integrated form. A field effect transistor can provide the desired high input impedance, and a field effect transistor operating as a source follower can provide a low impedance output. However, this requires that all of the electrodes of the output field effect transistor are connected above ground potential, and this makes it difficult to construct the amplifier as an integrated rircuit.

It is an object of the present invention to provide an improved semiconductor amplifier.

A further object of the invention is to produce an amplifier including field effect transistors and which provides a high input impedance and a low output impedance.

Another object of the invention is to provide an amplifier including field effect transistors which can be easily constructed in integrated form.

A feature of the invention is the provision of a semiconductor amplifier including a pair of field effect transistors each having a source connected to a reference potential, with the gate and drain electrodes of the output transistor being biased to the same polarity. Since the source electrodes of both field effect transistors are at the same potential the construction in integrated form is facilitated.

Another feature of the invention is the provision of an amplifier including an input field effect transistor connected as a voltage amplifier with another field effect transistor connected thereto as a current limiting load, and an output field effect transistor having its gate electrode connected to the drain electrode of the input transistor, and its gate and drain electrodes biased to the same polarity so that it exhibits a characteristic similar to that of a triode vacuum tube and has a low output impedance.

The invention is illustrated in the drawing wherein.

In practicing the invention, there is provided an amplifier circuit having an output stage formed by a field effect transistor with its source electrode connected to a reference potential, and with gate and drain electrodes both biased to the same polarity. Signals are applied to the output transistor by a field effect transistor having a channel of the opposite conductivity type, with its source electrode connected to the reference potential and its drain electrode connected through a current limiter to a biasing potential. The current limiter may be an additional field effect transistor. Input signals applied to the gate of the input transistor are coupled from the drain thereof to the gate of the output transistor, and the output of the amplifier is derived at the drain of the output transistor. The output transistor has a characteristic similar to that of a triode tube, since the potential applied to the gate and drain are of the same polarity and the gate bias tends to block the channel while the potential at the drain tends to open the channel. The overall amplifier circuit provides a high input impedance and a low output impedance.

Figures 1, 2:
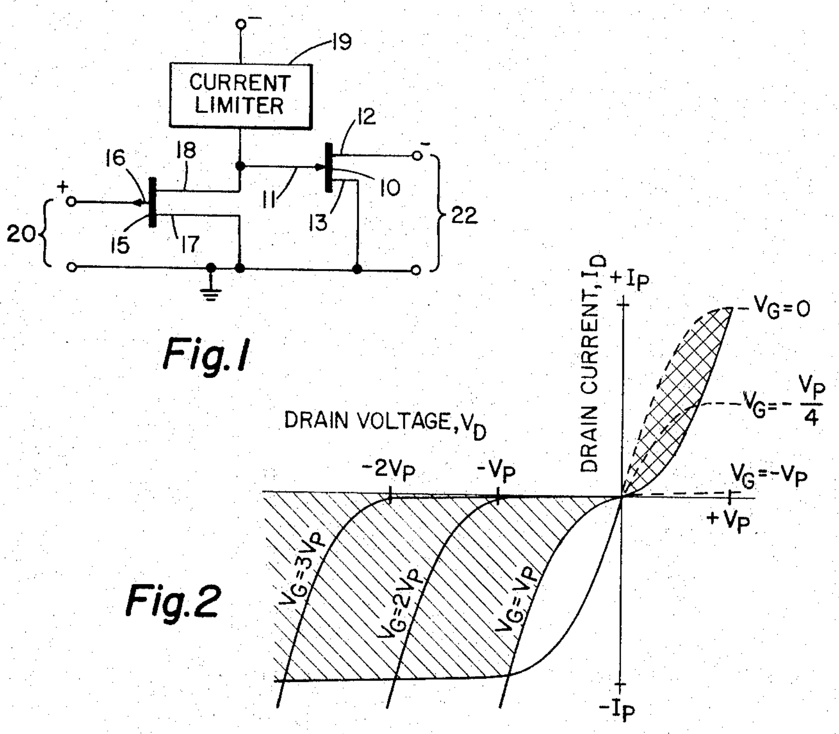
FIG. 1 is a schematic diagram illustrating the semiconductor amplifier of the invention.
FIG. 2 is a chart illustrating the characteristics of the output field effect transistor stage in the circuit of FIG. 1.

Referring now to the drawing, in FIG. 1 there is shown an amplifier circuit including an output stage formed by field effect transistor 10. The transistor 10 is illustrated as having an N-type channel with the source electrode 13 connected to a reference potential, and a negative potential applied to the gate electrode 11. A negative potential is also applied to the drain electrode 12. This is to be contrasted to normal operation wherein the potential applied to the drain electrode would be positive.

The second field effect transistor 15 has a P-type channel and forms the input stage of the amplifier. Transistor 15 has a gate electrode 16 connected to a positive potential, a source electrode 17 connected to the reference potential, and a drain electrode 18 connected through current limiter 19 to a negative bias potential. The current limiter may have various different forms, such as a large resistor or a field effect transistor having its gate and source electrodes connected together. The use of a field effect transistor as a current limiter has the advantage that a lower bias voltage can be used, since the use of a large resistor requires the use of a large bias voltage to provide for the drop across the resistor. The circuit of FIG. 1 exhibits a high input impedance at the input terminals 20 which are connected between the gate electrode 16 of transistor 15 and the reference potential. The amplifier circuit exhibits a low output impedance at terminals 22 which are connected from the drain electrode of transistor 10 to the reference potential.

Considering now the operation of the output transistor 10, reference is made to FIG. 2 which shows the characteristics of a field effect transistor. In the first quadrant of FIG. 2, the characteristic obtained when a positive potential is applied to the drain electrode 12 is shown. This will cause a positive drain current, and the operating region is illustrated by the cross hatched portion in the first quadrant of FIG. 2. Operation of the transistor 10 with a negative drain voltage is shown in the third quadrant. When operating in this mode, the transistor has a low output impedance and characteristics similar to those of a triode vacuum tube. Transistor 10 may be operated in this mode through the relatively large region shown by the single hatched portion.

Considering now the analysis of the operation of the stage 10, this is described in an article by W. Shockley entitled, "A Unipolar Field Effect Transistor," published in the Proceedings of the I.R.E., vol. 40, November 1952, pages 1365 to 1376. As set forth in this article, the characteristics of the field effect transistor are defined by the following equation:

$$I_D=G(V_D-V_G)\left[1-\frac{2}{3}\left(\frac{V_D-V_G}{V_P}\right)^{1/2}\right]-G(V_S-V_G)\left[1-\frac{2}{3}\left(\frac{V_S-V_G}{V_P}\right)^{1/2}\right]$$

In this equation $I_D$ is the drain current, G is the low voltage of undepleted conductance of the channel, $V_D$ is the voltage applied to the drain, $V_G$ is the voltage applied to the gate, $V_S$ is the voltage applied to the source, and $V_P$ is the voltage which must be applied to the drain with the source and gate grounded to cause the depletion layers to meet at the drain end of the channel.

The above equation holds for either N-channel or P-chanel devices and the quantity $V_P$ is positive for an N-channel unit and negative for a P-channel unit. When biasing the transistor with the gate and drain at the same polarity, as described above, and with the source connected to a reference potential, the output characteristics can be represented by the following equation:

$$I_D=G(V_D-V_G)\left[\ -\frac{2}{3}\left(\frac{V_D-V_G}{V_P}\right)^{1/2}\right]-I_P$$

In this formula $$I_P=\frac{GV_P}{3}$$

and the remaining elements in the equation are the same as in the preceding equation. This equation holds throughout the relative large single hatched area in the third quadrant of FIG. 2.

Figure 3:
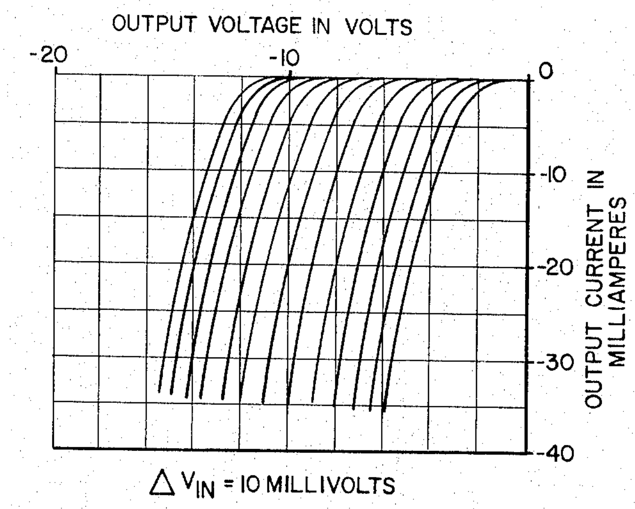
FIG. 3 illustrates the overall characteristics of the circuit of FIG. 1.

FIG. 3 shows the output characteristics for the overall configuration including the voltage amplifier transistor 15 and the output transistor 10. The voltage gain may be of the order of 100, with an output impedance of the order of 80 ohms and an input impedance of several megohms as provided by a small field effect transistor.

Figure 4:
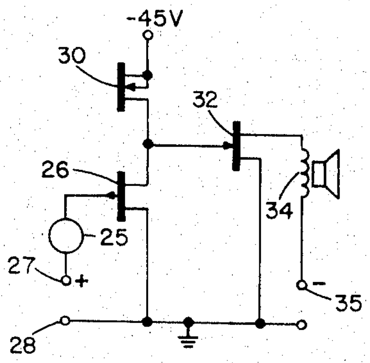
FIG. 4 is a circuit diagram illustrating the circuit of FIG. 1 in an audio amplifier receiving input signals from a high impedance microphone and driving a low impedance loudspeaker.

FIG. 4 illustrates an application of the circuit of FIG. 1. In this application the amplifier is used to amplify audio signals from a high impedance crystal microphone 25. Input signals from the crystal microphone are applied to the gate electrode of the field effect transistor 26 which has a P-type channel. Positive bias is, therefore, applied at terminal 27 with reference to the ground conductor 28. Transistor 26 is biased in the conventional manner with a negative potential being supplied through current limiting field effect transistor 30. The drain of transistor 26 is applied to the gate of transistor 32, which has an N-type channel. The drain of transistor 32 is connected through the loudspeaker 34 to a negative potential at terminal 35. The speaker 34 may have an impedance of the order of 24 ohms which may be coupled to the low impedance output of the amplifier. It will be noted that both the gate and drain of transistor 32 are negatively biased so that the transistor operates in accordance with the analysis set forth above.

The amplifier described is obviously suitable for use in many other applications. Since the source electrodes of both the input and output field effect transistors are at the same potential, and the drain electrode of the input transistor is connected to the gate of the output transistor, the structure can be readily provided in integrated form.

It will be obvious that the transistors can have channels of opposite conductivity type in which case bias potentials of opposite polarities will be applied.

I claim:

1. An amplifier circuit including in combination, a field effect output transistor having source, drain and gate electrodes, with the source electrode connected to a reference potential, a field effect input transistor having source, drain and gate electrodes, with the source electrode connected to said reference potential, said field effect output transistor being opposite in conductivity from said field effect input transistor, means connecting said drain electrode of said input transistor to said gate electrode of said output transistor, high impedance input circuit means connected to said gate electrode of said input transistor and having an input terminal, current limting means connecting said drain electrode of said input transistor to a bias terminal adapted to receive a bias potential of one polarity, and low impedance output circuit means connected to said drain electrode of said output transistor and having an output terminal, said amplifier circuit operating in response to an input signal and a bias potential of the polarity opposite to said one polarity applied to said input terminal and to a bias potential of said one polarity applied to said output terminal to provide an amplified signal in said output circuit means.

2. An amplifier circuit including in combination, first and second field effect transistors each having source, drain and gate electrodes, with said source electrodes being connected to a reference potential, said second field effect transistor being opposite in conductivity from said first field effect transistor, means connecting said drain electrode of said first field effect transistor to said gate electrode of said second field effect transistor, the drain of said first field effect transistor and the gate of said second field effect transistor being of the same conductivity type semiconductor material to thereby facilitate constructing said amplifier circuit in integrated form, input circuit means connected to said gate electrode of said first transistor and having an input terminal, current limiting means connecting said drain electrode of said first field effect transistor to a bias terminal adapted to receive a bias potential of one polarity, and output circuit means connected to said drain electrode of said second field effect transistor and having an output terminal, said amplifier circuit operating in response to an input signal and a bias potential of the polarity opposite to said one polarity applied to said input terminal and to a bias potential of said one polarity applied to said output terminal to provide an amplified signal in said output circuit means.

3. An amplifier circuit including in combination, first and second field effect transistors each having source, drain and gate electrodes, with the source electrodes being connected to a reference potential, said first field effect transistor being opposite in conductivity from said second field effect transistor, input circuit means connected to said gate electrode of said first transistor and having an input terminal, current limiting means connecting said drain electrode of said first transistor to a bias terminal adapted to receive a negative bias potential, means connecting said drain electrode of said first field effect transistor to said gate electrode of said second field effect transistor, and output circuit means connected to said drain electrode of said second field effect transistor and having an output terminal, said amplifier circuit operating in response to an input signal and a positive bias potential applied to said input terminal and to a negative bias potential applied to said output terminal to provide an amplified signal in said output circuit means.

4. An amplifier circuit including in combination, first and second field effect transistors each having source, drain and gate electrodes, with the source electrodes being connected to a reference potential, said first field effect transistor being opposite in conductivity from said second field effect transistor, input circuit means connected to said gate electrode of said first transistor, said input circuit means having an input terminal for receiving an input signal and a bias potential of one polarity and applying the same to said gate electrode of said first transistor, current limiter means connecting said drain electrode of said first transistor to a bias terminal adapted to receive a bias potential of the polarity opposite to said one polarity, means connecting said drain electrode of said first field effect transistor to said gate electrode of said second field effect transistor, and output circuit means connected to said drain electrode of said second field effect transistor, said output circuit means having an output terminal for connection to a bias potential of said opposite polarity, said amplifier circuit having connections only to said reference potential and to said input, bias and output terminals, said input circuit means cooperating with said first field effect transistor to provide a relatively high impedance between said input terminal and said reference potential, and said output circuit means cooperating with said second field effect transistor to provide a relatively low impedance between said output terminal and said reference potential.

5. An amplifier circuit including in combination, first and second field effect transistors each having source, drain and gate electrodes, with the source electrodes being connected to a reference potential, said first field effect transistor being opposite in conductivity from said second field effect transistor, input circuit means connected to said gate electrode of said first transistor, said input circuit means having an input terminal for receiving an input signal and a positive bias potential and applying the same to said gate electrode of said first transistor, current limiter means connecting said drain electrode of said first transistor to a bias terminal adapted to receive a negative bias potential, means connecting said drain electrode of said first field effect transistor to said gate electrode of said second field effect transistor, and output circuit means connected to said drain electrode of said second field effect transistor, said output circuit means having an output terminal for connection to a negative bias potential, said amplifier circuit having connections only to said reference potential and to said input, bias and output terminals, said input circuit means cooperating with said first field effect transistor to provide a relatively high impedance between said input terminal and said reference potential, and said output circuit means cooperating with said second field effect transistor to provide a relatively low impedance between said output terminal and said reference potential.

6. An amplifier circuit including in combination, first and second field effect transistors each having source, drain and gate electrodes, with the source electrodes being connected to a reference potential, said first field effect transistor being opposite in conductivity from said second field effect transistor, input circuit means connected to said gate electrode of said first transistor, said input circuit means having an input terminal for receiving an input signal and a bias potential of one polarity and applying the same to said gate electrode of said first transistor, current limiter means including a further field effect transistor connecting said drain electrode of said first transistor to a bias terminal adapted to receive a bias potential of the polarity opposite to said one polarity, means connecting said drain electrode of said first field effect transistor to said gate electrode of said second field effect transistor, and output circuit means connected to said drain electrode of said second field effect transistor, said output circuit means having an output terminal for connection to a bias potential of said opposite polarity, said amplifier circuit having connections only to said reference potential and to said input, bias and output terminals, said input circuit means cooperating with said first field effect transistor to provide a relatively high impedance between said input terminal and said reference potential, and said output circuit means cooperating with said second field effect transistor to provide a relatively low impedance between said output terminal and said reference potential.

7. An amplifier circuit including in combination, a first field effect transistor of one conductivity type having source, drain and gate electrodes, a second field effect transistor of opposite conductivity type also having source, drain and gate electrodes, the source electrodes of said first and second field effect transistors connected to a reference potential, said gate electrode of said second transistor connected to bias potential of one polarity, current limiting means connecting said drain electrode of said second field effect transistor to a bias terminal for receiving thereat a bias potential having a polarity opposite to that of the bias potential applied to the gate electrode of said second field effect transistor, conductive means connecting the drain electrode said second field effect transistor to the gate electrode of said first field effect transistor, an output terminal connected to the drain electrode of said first field effect transistor and receiving thereat a bias potential of said opposite polarity; the polarity of the signal applied to the gate electrode of the first field effect transistor being that of the bias potential applied to the drain electrode of the first field effect transistor so that an increase in signal level at the gate electrode of the first field effect transistor tends to pinch off the channel region thereof an an increase in the bias level at the drain electrode of the first field transistor tends to unpinch the channel region thereof and lower the channel impedance, whereby the output impedance of said amplifier between said output terminal and said reference potential is relatively low and the input impedance of said amplifier between the gate electrode of said second field effect transistor and said reference potential is high and thus imparts a high gain characteristic to said amplifier.

8. An amplifier circuit including in combination an input P channel field effect transistor having source, gate and drain electrodes with the gate electrode thereof connected to an input terminal to which a positive gate bias is applied, a current limiting load connected between the drain electrode of the input field effect transistor and a bias terminal to which a negative bias potential is applied, an output N channel field effect transistor having source, gate and drain electrodes with the gate electrode thereof connected directly to the drain electrode of the input field effect transistor, the source electrodes of both the input and the output field effect transistors connected to a common reference potential, and an output terminal connected to the drain electrode of the output N channel field effect transistor and to which a negative bias potential is applied for unpinching the N channel of the output field effect transistor when the N channel is pinched off by the signal applied to the gate electrode of the output field effect transistor, the drain region of the P channel input field effect transistor and the gate region of the N channel output field effect transistor being the same conductivity type semiconductor material thereby facilitating the construction of said amplifier circuit in integrated form, said amplifier circuit having a minimum of terminals consisting of a terminal to which the source electrodes of the input and output field effect transistors are connected to the reference potential, the input terminal connected to the gate electrode of the input field effect transistor, the bias terminal connected to the current limiting load, and the output terminal connected to the drain electrode of the output field effect transistor and to which an output load may be connected and driven by the low impedance between said output terminal and said reference potential.

9. The amplifier circuit as defined in claim 8 wherein said current limiting load includes a field effect current limiter having source, gate and drain electrodes and the source electrode thereof connected to the drain electrode of the input field effect transistor and to the gate electrode of said output field effect transistor, the source region of the field effect current limiter, the drain region of the input field effect transistor and the gate region of the output field effect transistor being of the same conductivity type semiconductor material thereby facilitating the construction of said amplifier in monolithic integrated form in a body of semiconductor material.

References Cited

UNITED STATES PATENTS 3,210,677 10/1965 Lin et al. ------------ 330—17

OTHER REFERENCES

"Field Effect Transistors," Theory and Applications Notes No. 1, Amelco Semiconductor, June 1962, pp. 6, 7.

Smith, "Low-Noise Fets Sound Good to Circuit Designers," Electronics, Dec. 14, 1964, pp. 58–61, 307–88.5/21.4.

ROY LAKE, *Primary Examiner.*

J. B. MULLINS, *Assistant Examiner.*